(12) United States Patent
Gontcharov

(10) Patent No.: US 9,231,522 B2
(45) Date of Patent: Jan. 5, 2016

(54) GENERATION OF BAND-LIMITED NOISE WITH TUNABLE CREST FACTOR

(71) Applicant: Harman International Industries Ltd., Herts (GB)

(72) Inventor: Vladimir Gontcharov, Huntingdon (GB)

(73) Assignee: Harman International Industries Ltd., Herts (GB)

(*) Notice: Subject to any disclaimer, the term of this patent is extended or adjusted under 35 U.S.C. 154(b) by 579 days.

(21) Appl. No.: 13/646,273

(22) Filed: Oct. 5, 2012

(65) Prior Publication Data

US 2013/0088277 A1    Apr. 11, 2013

(30) Foreign Application Priority Data

Oct. 5, 2011    (EP) .................................... 11183954

(51) Int. Cl.

| | | |
|---|---|---|
| *G01R 23/00* | (2006.01) | |
| *H03B 29/00* | (2006.01) | |
| *G06F 11/30* | (2006.01) | |
| *H04R 29/00* | (2006.01) | |

(52) U.S. Cl.
CPC .............. *H03B 29/00* (2013.01); *H04R 29/004* (2013.01)

(58) Field of Classification Search
CPC .............................. H03B 29/00; H04R 29/004
See application file for complete search history.

(56) References Cited

U.S. PATENT DOCUMENTS

| | | | | |
|---|---|---|---|---|
| 6,529,925 | B1 * | 3/2003 | Schenk | .......................... 708/300 |
| 7,142,831 | B2 * | 11/2006 | Anvari | ......................... 455/114.2 |
| 2010/0176867 | A1 | 7/2010 | Appel et al. | |
| 2010/0213924 | A1 | 8/2010 | Osumi et al. | |

FOREIGN PATENT DOCUMENTS

| | | |
|---|---|---|
| JP | 61142967 | 6/1986 |
| JP | 2009-232270 | 10/2009 |
| WO | 2011026266 | 3/2011 |

OTHER PUBLICATIONS

Narahashi et al., "A New Phasing Scheme for Multitone Signal Systems to Reduce Peak-to-Average-Power Ratio (PAPR)", The Institute of Electronics, Information and Communication Engineers; Journal of Institute of Electronics, Information and Communication Engineers B-II, The Transactions of the Institute of Electronics, Information and Communication Engineers, Nov. 25, 1995, No. 11, p. 663-671.
Japanese Office Action.

(Continued)

*Primary Examiner* — Phuong Huynh
(74) *Attorney, Agent, or Firm* — O'Shea Getz P.C.

(57) ABSTRACT

A method for generating a signal having a defined bandwidth and a desired crest factor is disclosed. The signal is composed of a number of individual sinusoidal signals, each having an amplitude and a frequency. The method includes determining an exponent to be used in a specific exponential function and corresponding to the desired crest factor, the exponent being determined based on an a priori known relationship between crest factor and exponent; calculating a phase value for each sinusoidal signal using the specific exponential function and the previously determined exponent; and superposing the sinusoidal signals to obtain the signal having the desired crest factor, whereby the phases of the individual signals are maintained.

9 Claims, 4 Drawing Sheets

(56) References Cited

OTHER PUBLICATIONS

Natarajan et al., "Crest Factor Reduction in MC-CDMA Employing Carrier Interferometry Codes", EURASIP, Journal on Wireless Communications and Networking, 2004, 374-379.

Guillaume et al., "Crest-Factor Minimization Using Nonlinear Chebyshev Approximation Methods", IEEE Transactions on Instrumentation and Measurement, vol. 40, No. 6, Dec. 1991.

Boyd, "Multitone Signals with Low Crest Factor", IEEE Transactions on Circuits and Systems, vol. 33, No. 10, pp. 1018-1022, 1986.

Newman, "An L1 extremal problem for polynomials", Proc. Amer. Math. Soc., vol. 16, pp. 1287-1290, 1965.

Wu, "A polynomial phasing scheme to realize minimum crest factor for multicarrier transmission", Wireless Telecommunications Symposium, 2010, pp. 1-5.

Rees et al., "Design and application of non-binary low peak factor signals for system dynamic measurement", Control 1991, International Conference on Edinburgh, UK, pp. 644-650.

\* cited by examiner

GENERATION OF BAND-LIMITED NOISE WITH TUNABLE CREST FACTOR

1. CLAIM OF PRIORITY

This patent application claims priority from EP Application No. 11 183 954.4 filed Oct. 5, 2011, which is hereby incorporated by reference.

2. FIELD OF TECHNOLOGY

The present invention relates to the test signal generation for use in measurement, control, and signal transmission applications. In particular, one example of the present invention relates to a novel method for generating a noise signal having narrow-band, adjustable crest factor.

3. RELATED ART

An important part of the solution of a measurement problem is the choice of the input signals, which are often referred to as test signals. In a lot of problems, e.g., control systems, the input is generated by the environment or "real-life" systems and cannot be changed without great problems. However, there is also a very important class of problems where the choice of the input signal is determined by a general test specification, e.g., quality control measurements during or at the end of a production process. Furthermore, test signals are used in measurements for testing and validating a technical design during product development. Just to give one example, test audio signals are required to test and validate the performance of newly designed audio systems including Hi-Fi amplifiers and loudspeakers. In the past, the choice of the experiments was determined mainly by the intuition of the developer or general standards related to audio. Typical constraints that may have to be considered when choosing test audio signals in practice are amplitude constraints on input, outputs, or internal variables, power constraints on input, outputs, or internal variables, the total time available for the experiment, and the total number of samples that can be taken or analyzed.

In many cases the aim of an experimental set-up is to increase the signal-to-noise ratio as much as possible. This cannot be done solely by an increase of the amplitude of the input signal due to amplitude constraints (to keep a linear behavior of the device under test and to avoid overflow on the measurement systems). A more efficient approach is to increase the energy of the signal for a given amplitude extreme or to decrease the amplitude extremes for a given energy. This operation is called peak factor minimization. The peak factor is also commonly referred to as crest factor (CF) or peak-to-average ratio (PAR). In the further disclosure the term crest factor will be used.

Although, some research has been done in minimizing the crest factor of signals there still remains a need for the generation of test signals with a crest factor that can be specified to comply with the requirements of the experimental set-up. In particular, in some modern test techniques the need arises for specific test signals having a complex crest factor distribution over the spectral bandwidth of the signal. One example of this may be a test where the signal is closely related to a music signal. For example, in audio signals representing music, the crest factor may not only vary in time but also have different values in narrow-band sub-bands which contribute to the broad-band music signal. For such broad-band test signals it is desirable to control the crest-factor in the sub-bands.

SUMMARY OF THE INVENTION

A method for generating a signal having a defined bandwidth and a desired crest factor is disclosed. The signal is composed of a number of individual sinusoidal signals, each having an amplitude and a frequency. The method includes determining an exponent to be used in a specific exponential function and corresponding to the desired crest factor, the exponent being determined based on an a priori known relationship between crest factor and exponent; calculating a phase value for each sinusoidal signal using the specific exponential function and the previously determined exponent; and superposing the sinusoidal signals to obtain the signal having the desired crest factor, whereby the phases of the individual signals are maintained.

Further, a corresponding test signal generator is disclosed.

These and other objects, features and advantages of the present invention will become apparent in light of the detailed description of the best mode embodiment thereof, as illustrated in the accompanying drawings. In the figures, like reference numerals designate corresponding parts.

DESCRIPTION OF THE DRAWINGS

The invention can be better understood referring to the following drawings and descriptions. In the figures like reference numerals designate corresponding parts. In the drawings.

DETAILED DESCRIPTION OF THE INVENTION

Figure 1:
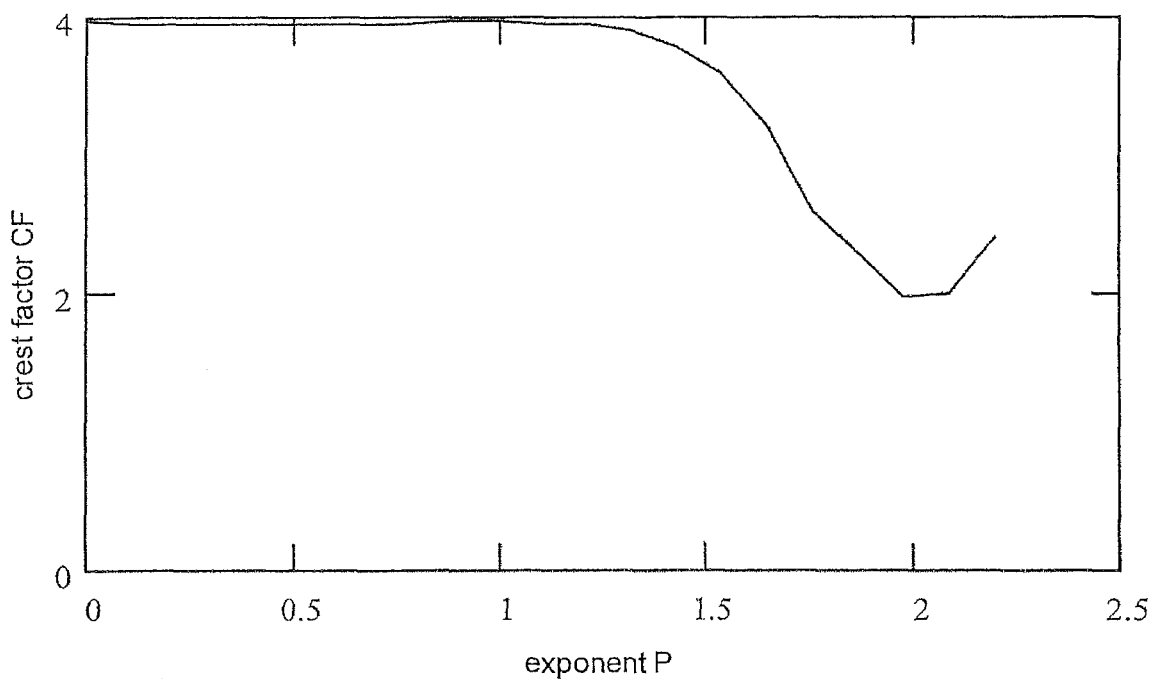
FIG. 1 illustrates the relation between the crest factor (or PAR) of a multitone signal and the exponent P in the Equation (4) whereby the crest factor has been calculated for a multitone signal composed of eight sine waves having random amplitude and phases in accordance with Equation (4)

One of the issues in signal transmission technology is reduction/minimization of the crest factor of the transmitted signal. Some research has been done concerning this reduction/minimization problem (see, for example, S. Boyd: Multitone Signals with Low Crest Factor, in: IEEE Transactions on Circuits and Systems, vol. 33, no. 10, pp. 1018-1022, 1986). While reduction/minimization of the crest factor is well known, there is little or no knowledge of how to control the crest factor at a given desired level or to control the crest factor spectral parts (sub-bands) of the signal such as the narrow-band constituent sub-bands of the broad band signal.

A typical broadband signal f(t) may be decomposed into its constituent sine waves (also referred to as "spectral lines") each having a certain amplitude and phase. This may be accomplished by applying a Fourier transform operation (usually implemented using a Fast Fourier Transform, FFT).

Therefore the signal f(t) is time-discretized (digitized) yielding a sampled signal f[n] wherein the symbol "n" represents the number of the sample located "n" positions (sometimes called "bins") away from the origin of the signal. The discretization requires the definition of certain parameters such as the sampling frequency ($f_S$) or the time resolution $dt=f_S^{-1}$ which define the time separation between the discretized samples f[n−1], f[n], f[n+1], etc. When sampling a signal having a given spectral composition the sampling frequency must be high enough (in accordance with the Nyquist-Shannon sampling theorem) to avoid aliasing. To avoid aliasing problems, the further discussion will be concentrated on so called multisine or multitone signals which are broad-band signals having defined single sine wave constituents composing the broad-band signal. Such signals have a defined maximum frequency $f_{MAX}$ and thus a defined minimum sampling frequency which is twice the maximum frequency $f_{MAX}$. The number of single sine wave constituents (or samples) is determined by the time length of the multitone signal.

Generally, the band-limited multisine signal f(t) can be denoted as:

$$f(t) = \sum_{i=N_0+1}^{N_0+N} A_i \cos(2\pi \cdot f_i \cdot t + \varphi_i), \tag{1}$$

wherein i is the index of the spectral line ($N_0$ is the index offset), N the number of spectral lines (tones) composing the tests signal f(t), $A_i$ the amplitude, $\varphi_i$ the phase and $f_1$ the frequency of the $i^{th}$ tone. It should be noted that the root-mean-square (RMS) value $F_{RMS}$ of the signal f(t) is:

$$F_{RMS} = \sqrt{\frac{1}{T_2-T_1} \int_{T_1}^{T_2} |f(t)|^2 \, dt}. \tag{2}$$

A sampled (discretized) version of the multitone signal f(t) is obtained by substituting $t=n/f_S$ and the discretized signals is denoted as f[n]:

$$f[n] = \sum_{i=N_0+1}^{N_0+N} A_i \cos\left(\frac{2\pi \cdot f_i}{f_S} \cdot n + \varphi_i\right). \tag{3}$$

The root-mean-square (RMS) value can also be expressed as:

$$F_{RMS} = \sqrt{\frac{1}{2} \sum_{i=N_0+1}^{N_0+N} |A_i|^2} \tag{4}$$

leading to a crest factor of:

$$CF=(\max\{f(t)\}-\min\{f(t)\})/(2F_{RMS}). \tag{5}$$

The crest factor CF of a pure sine signal equals √2. Furthermore the crest factor must be greater than one due to its definition.

For many applications band-limited noise (e.g., pseudo-random) signals are required. However, a low crest factor is still desirable for such noise signals. One brute force number crunching technique includes applying randomly chosen sets (e.g., within the interval [0, 2π[) of phase values $\varphi_i$ (i=$N_0$+1, ..., $N_0$+N) to a multisine signal and calculating the crest factor. This is done a large number of times, for example, 100 times. The phase set yielding the best crest factor is retained. Experiments show that, for flat magnitude spectra, this typically gives crest factors of minimum 1.8. Taking a much larger number of phase sets does not help much due to the vastness and complexity of the (N−1)-dimensional parameter space. For random amplitude multisine signals crest factors of about 2.1 may be achieved (for N<50).

Research has shown that, at a given number N of sine tones which contribute to the test signal f(t), a low crest factor (lower than using the above-mentioned brute-force method) can be achieved if the phases $\varphi_i$ used in Equation 1 are set according to:

$$\varphi_i = -\pi \frac{i^2}{N}, \tag{6}$$

that is the phases of the individual tones are in a quadratic relation (further referred to as "Newman Phases" after D. J. Newman, see also D. J. Newman: An L1 extremal problem for polynomials, Proc. Amer. Math. Soc., vol 16, pp. 1287-1290, December 1965). Furthermore, it turned out that the crest factor reduces for a large number N of individual tones contributing to the test signal f[n].

In accordance with one aspect of the invention the exponent "2" in the nominator of Equation 6 is substituted by a general variable P, that is:

$$\varphi_i = -\pi \frac{i^P}{N}. \tag{7}$$

In the following the results of investigations are presented illustrating how the exponent P and the crest factor are related when using test signals formed in accordance with Equation 1. FIG. 1 illustrates the relation between the exponent P and the resulting crest factor CF of a signal f(t) which is composed by a plurality of sine tones (see Equation 1) whose individual phases are set in accordance to eqn. 7. It should be noted that in accordance with the results of Newman, a minimum crest factor CF of about two is obtained using an exponent P of approximately two. In contrast, for exponents P equal to or lower than approximately 1 a maximum crest factor of about four is obtained. Between (approximately) P=1 and P=2 the crest factor is a monotonously falling function of P.

Figure 2:
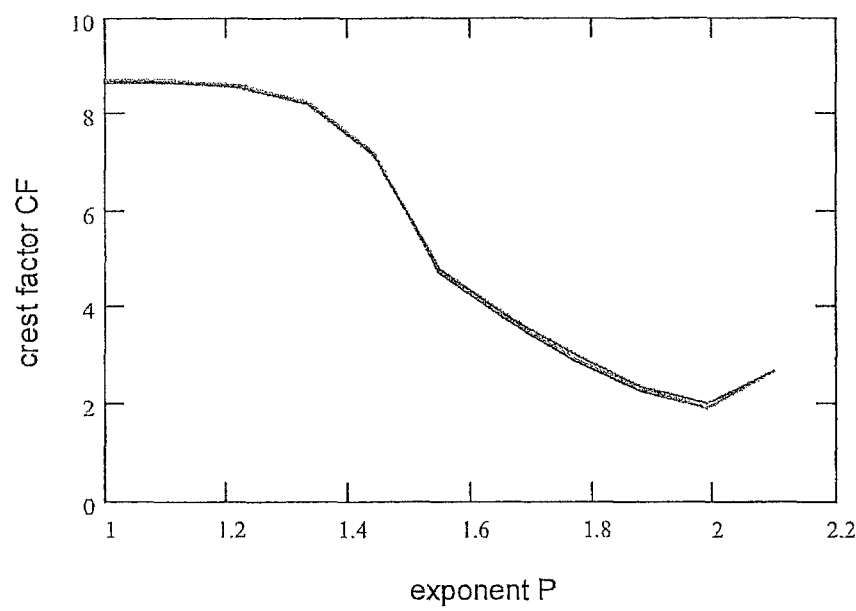
FIG. 2 illustrates the crest factor (or PAR) of a multitone signal as a function of the exponent P from the Equation (4) for different sampling frequencies.

In order to check for other factors which might have an impact on the crest factor, the sampling rate (44.1 kHz, 22.05 kHz, and 14.7 kHz) of the test signal f(t) has been varied and the resulting curves (crest factor CF vs. exponent P) are illustrated in FIG. 2. One can see that the function CF(P) varies only marginally when varying the sampling rate. It should be noted that the maximum crest factor is about 8.7 in the examples of FIG. 2. This is due to the higher number of sine tones contributing to the test signal f(t) as compared to the example of FIG. 1. Nevertheless, the sampling rate of the test tone has no significant impact on the crest factor.

Figure 3:
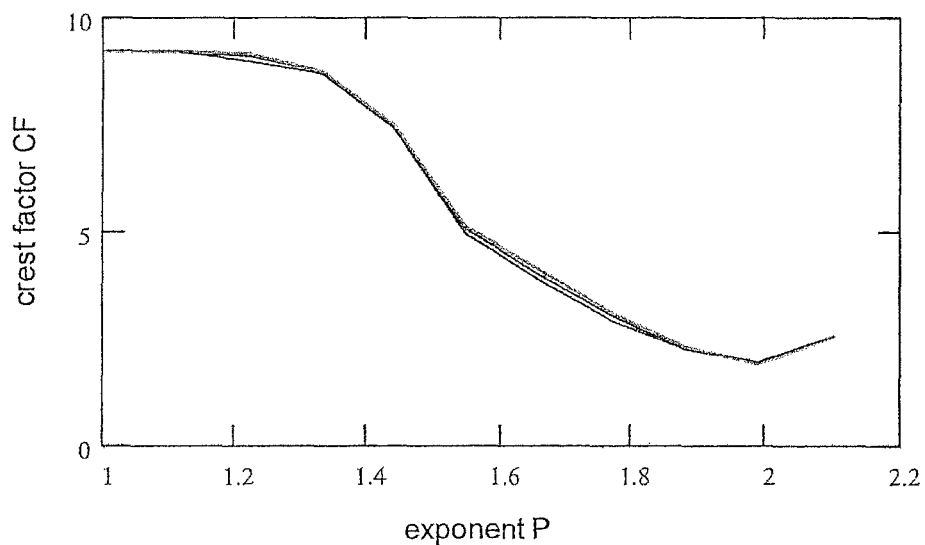
FIG. 3 illustrates the crest factor (or PAR) of a multitone signal as a function of exponent P from the Equation (4) for different center frequencies of the multitone signal.

Furthermore, the impact of the center frequency of the test signal f(t) on the crest factor has been investigated. A curve "crest factor over exponent P" has been determined for several test signals f(t) wherein each test signal is composed of the same number of sine tones. However, the center frequency of the test tones has been varied. The resulting curves are illustrated in FIG. 3 for test signal center frequencies of 500 Hz, 1000 Hz, and 3000 Hz. It can be seen from FIG. 3 that the center frequency of the test signal neither has a significant impact on the resulting crest factor. Similarly, it had been determined that the amplitudes of the individual sine tones contributing to the test signal may be varied without significantly changing the crest factor. This is only valid, however, if the amplitude of none of the individual sine tones is dominant.

Figure 4:
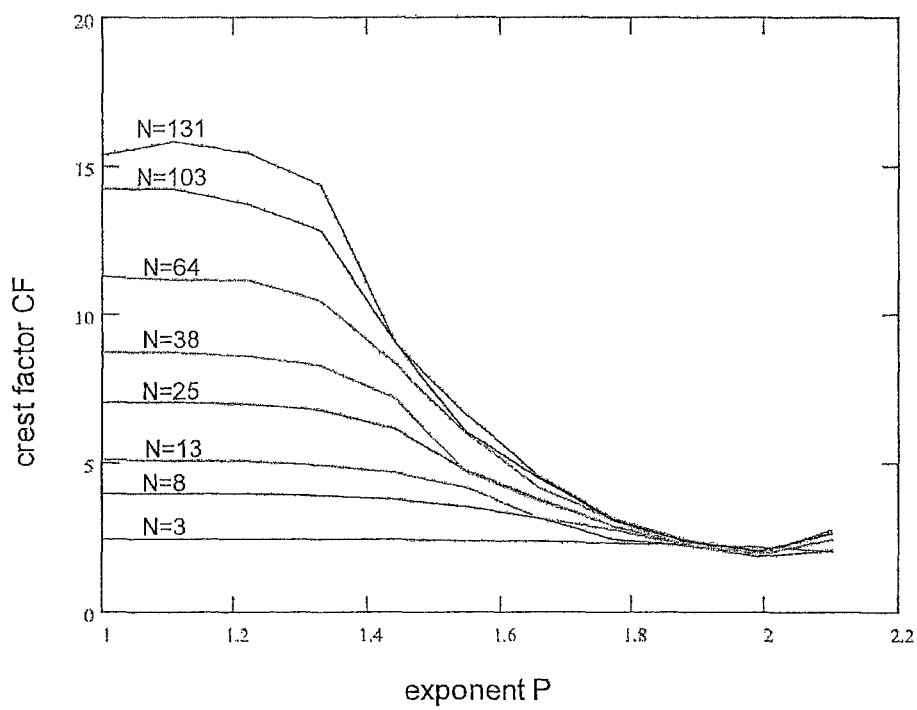
FIG. 4 illustrates the crest factor (or PAR) of a multitone signal as a function of exponent P from the Equation (4) for a different number of sine waves contributing to the multitone signal, the center frequency and the sampling frequency being constant.

Finally, the impact of the number of individual sine tones contributing to the "total" test signal has been investigated. FIG. 4 illustrates the "CF over P" curves for test signals composed of N=3, N=8, N=13, N=24, N=38, N=64, N=103, and N=131 individual sine tones. One can see that the maximum crest factor significantly depends on the number of sine tones whereas the position of the maximum does not. The previous result that the crest factor (approximately) is a monotonously falling function of the exponent P is still valid. The curve obtained for N=131 is slightly falling towards P=1 which is, however, negligible, for the present considerations. The trend of the crest factor between P=1 and P=2 is maintained independent of the number N of tones composing the test signal.

In view of the findings presented above a signal generator may be configured to generate a band limited test signal composed of a number N of sine tones, each sine tone having a phase in accordance to Equation 7, wherein the desired crest factor can be specified as an input parameter. Starting from the desired crest factor the corresponding exponent P can be determined using the curves depicted in FIG. 4 (or a function approximating that curves). Having determined the exponent P corresponding to the desired crest factor the phases $\phi_i$ of the individual sine tones contributing to the test signal can be determined and finally the sine tones are superposed to form the test signal whose crest factor matches, within an unavoidable tolerance band, the desired crest factor.

In accordance with another aspect of the present invention broad-band (multitone) test signals may be generated which have a different crest factor in different narrow-band sub-bands which compose the broad-band signal. In each sub-band the crest factor may be chosen to match a desired crest factor. A defined crest factor in specific sub-bands may be required in certain test procedures.

Below some important aspects of the test signal generation are summarized:

Firstly, a test signal prototype is defined having a desired (full) bandwidth and a desired duration. This prototype may be, inter alia, generated by filtering noise using a specific filter characteristics. However, many other considerations may play a role when defining the test signal prototype.

Secondly, and if required, the prototype signal is decomposed into a sum of sinusoidal signals as expressed by Equation 1, each sinusoidal signal having an amplitude $A_i$ and a frequency $f_i$ (subscript i being an index numbering the individual sinusoidal signals). This may be achieved, for example, by performing a Fourier series decomposition (e.g., using an FFT or related methods) of the prototype signal.

Thirdly, a desired crest factor is defined, either for the full band prototype signal, or for at least one narrow-band sub-band signal of the broad-band prototype signal. The sub-band signals may be obtained by selecting a number of individual tones composing the desired sub-band signal. For example, it is assumed that the prototype signal includes 32 individual tones (i.e., sine waves) whose spectral lines may be, but not necessarily have to be, equally spaced throughout the audible frequency range (about 50 Hz-20 kHz). Further it is assumed that the prototype signal is split into four (k=1, 2, 3, 4) sub-band signals $f_{SUB,k}(t)$ each comprising eight individual tones:

$$f_{SUB,k}(t) = \sum_{i=8k-7}^{8k} A_i \cos(2\pi \cdot f_i \cdot t + \varphi_i). \tag{8}$$

Fourthly, the crest factor can be designed to match a desired value for each sub-band signal. For this purpose the phases $\phi_i$ are calculated using an appropriate exponent P which may be directly be derived from the corresponding desired crest factor.

Having defined the frequency, amplitudes, and phases of the prototype signal (or of the constituent sub-band signals) the actual test signal can by synthesized using any appropriate method. For example, the test signal may be repeatedly outputted using a digital to analog converter.

Figure 5:
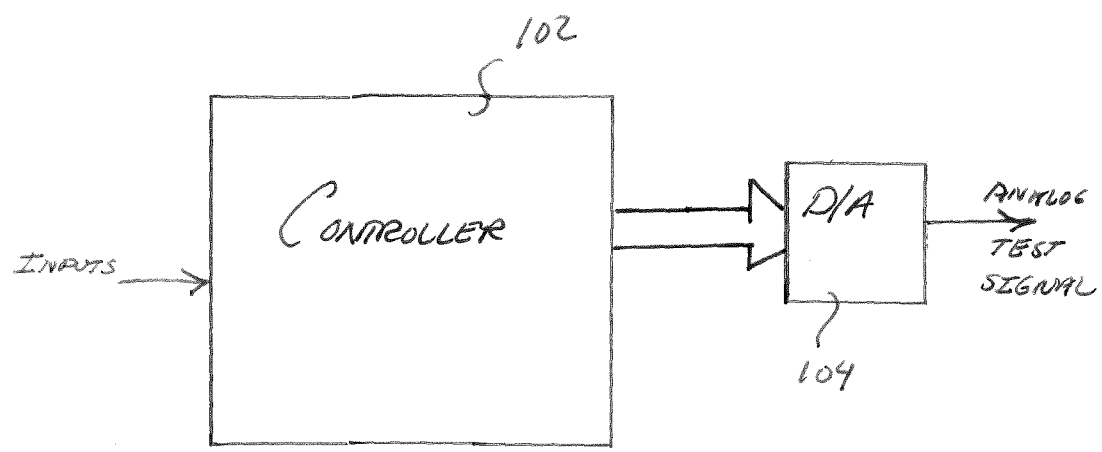
FIG. 5 is a block diagram illustration of a test signal generator.

FIG. 5 is a block diagram illustration of a test signal generator 100. The test signal generator includes a controller 102 that may include a processor (e.g., digital signal processor, microprocessor, etc), memory, inputs and outputs and other hardware known to those skilled in the art to form the desired test signal using the methods set forth above. The discrete time test signal may be output to a digital-to-analog convertor 104 that provides a continuous time test signal on line 106.

Figure 6:
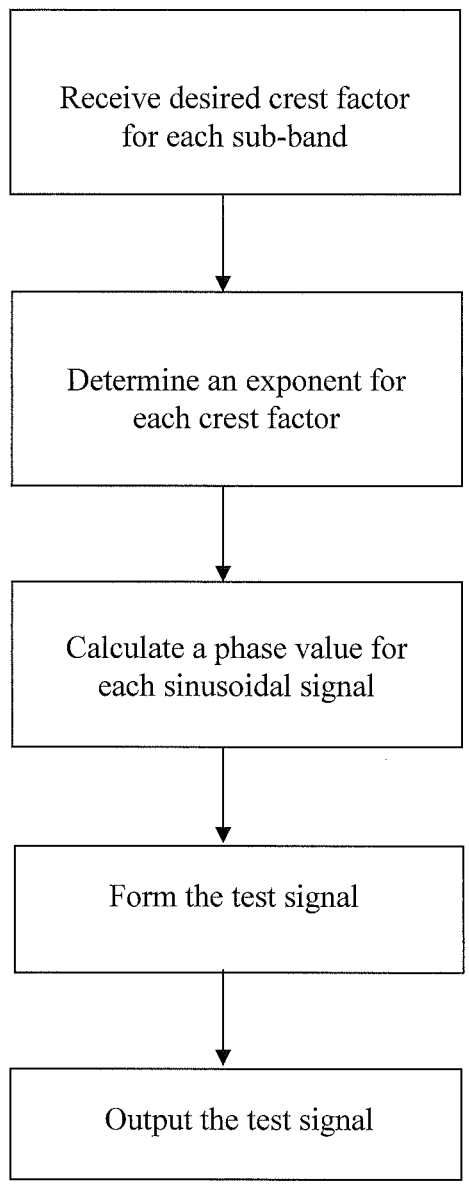
FIG. 6 is a flow chart illustration of a method of generating band-limited noise with tunable crest factor.

FIG. 6 is a flow chart illustration of a method of generating band-limited noise with tunable crest factor. The steps may be performed via executable program instructions executing within the controller 102 (FIG. 5).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may include any such individual feature or combination of features. In view of the foregoing description it will be evident to a person skilled in the art that various modifications may be made within the scope of the invention.

Although the present invention has been illustrated and described with respect to several preferred embodiments thereof, various changes, omissions and additions to the form and detail thereof, may be made therein, without departing from the spirit and scope of the invention.

What is claimed is:

1. A method of providing a test signal comprising one or more sub-band signals each composed of a number of sinusoidal signals, each sinusoidal signal having an individual frequency and phase wherein each frequency is associated with a frequency index and the corresponding phase is an exponential function of the frequency index, the method comprising:
   receiving a desired crest factor value for each sub-band signal;
   determining an exponent corresponding to the crest factor based on an a priori known relationship between crest factor and exponent;
   calculating a phase value for each sinusoidal signal using the exponential function and the previously determined exponent;
   superposing the sinusoidal signals associated with the sub-band signals to obtain the test signal having the desired crest factor(s) in each sub-band, whereby the phases of the individual signals are maintained; and
   outputting the test signal to an audio system.

2. The method of claim 1,
   wherein the test signal is composed of at least two sub-band signals each having a corresponding spectrum and the spectra of the sub-band signals composing the spectrum of the test signal, and
   wherein the phases of the sinusoidal signals composing the sub-band signals are calculated such that each sub-band signal has a corresponding desired crest-factor.

3. The method of claim of claim 1, wherein each frequency is associated with a frequency index and the corresponding phase calculates in accordance with the function $$\varphi_i = -\pi \frac{i^P}{N}$$

wherein i denotes the frequency index, $\varphi_i$ the corresponding phase, P the exponent characterizing the exponential function and N the number of sinusoidal signals contributing to the test signal.

4. The method of claim 1, wherein the step of determining the exponent the signal generator uses a predefined function approximating the known relationship between crest factor and exponent, the function includes the desired crest factor and the number of sinusoidal signals as input parameters and provides the corresponding exponent.

5. A method for generating an audio system test signal having a defined bandwidth and a desired crest factor, the signal being composed of a number of individual sinusoidal signals, each having an amplitude and a frequency, the method comprising:
   determining an exponent to be used in a specific exponential function and corresponding to the desired crest factor, the exponent being determined based on an a priori known relationship between crest factor and exponent;
   calculating a phase value for each sinusoidal signal using the specific exponential function and the previously determined exponent; and
   superposing the sinusoidal signals to obtain the audio system test signal having the desired crest factor, whereby the phases of the individual signals are maintained, and outputting the audio system test signal to an audio system under test.

6. A method for generating a test signal which is composed of two or more sub-band signals, the spectra of the sub-band signals composing the spectrum of the test signal, the method comprising:
   defining a prototype signal having a desired band-width and a desired duration;
   calculating a set of sinusoidal signals which, when superposed, at least approximately form the prototype signal, sub-set of the sinusoidal signals being grouped such that the sinusoidal signals of each sub-set are associated with one sub-band signal;
   associating a desired crest factor value to each sub-band signal;
   calculating the phases of each sub-band signal by
      determining an exponent to be used in a specific exponential function and corresponding to the desired crest factor, the exponent being determined based on an a priori known relationship between crest factor and exponent;
      calculating a phase value for each sinusoidal signal using the specific exponential function and the previously determined exponent; and
      superposing the sinusoidal signals to obtain the test signal having the desired crest factor, whereby the phases of the individual signals are maintained, and outputting the test signal to an audio system under test,
   wherein the resulting crest factor of each sub-band signal matches the corresponding desired crest factor.

7. The method of claim 6 wherein each frequency is associated with a frequency index and the corresponding phase calculates in accordance with the function $$\varphi_i = -\pi \frac{i^P}{N}$$

wherein i denotes the frequency index, $\varphi_i$ the corresponding phase, P the exponent characterizing the exponential function and N the total number of sinusoidal signals contributing to the respective signal.

8. The method of claim 5, wherein a predefined function approximating the known relationship between crest factor and exponent is used, the function including the desired crest factor and the number of sinusoidal signals as input parameters and provides the corresponding exponent.

9. A computer implemented method of providing an audio system test signal comprising one or more sub-band signals each composed of a plurality of sinusoidal signal components, each sinusoidal signal component signal having a discrete frequency and phase wherein each frequency is associated with a frequency index and the corresponding phase is an exponential function of the frequency index, the method comprising:
   receiving a desired crest factor value for each sub-band signal;
   determining an exponent corresponding to the crest factor;
   calculating a phase value for each sinusoidal signal using the exponential function and the previously determined exponent;
   superposing the sinusoidal signals associated with the sub-band signals to form the test signal having the desired crest factor(s) in each sub-band, whereby the phases of the individual signals are maintained; and
   outputting the audio system test signal to an audio system.

* * * * *